(12) United States Patent
Papalia et al.

(10) Patent No.: US 11,270,893 B2
(45) Date of Patent: Mar. 8, 2022

(54) LAYER-BY-LAYER ETCHING OF POLY-GRANULAR METAL-BASED MATERIALS FOR SEMICONDUCTOR STRUCTURES

(71) Applicant: International Business Machines Corporation, Armonk, NY (US)

(72) Inventors: John M. Papalia, New York, NY (US); Hiroyuki Miyazoe, White Plains, NY (US); Nathan P. Marchack, New York, NY (US); Sebastian Ulrich Engelmann, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 241 days.

(21) Appl. No.: 16/378,072

(22) Filed: Apr. 8, 2019

(65) Prior Publication Data
US 2020/0321220 A1 Oct. 8, 2020

(51) Int. Cl.
*H01L 21/3213* (2006.01)
*H01L 21/285* (2006.01)
(Continued)

(52) U.S. Cl.
CPC .. *H01L 21/32136* (2013.01); *H01L 21/28568* (2013.01); *H01L 21/32139* (2013.01);
(Continued)

(58) Field of Classification Search
CPC ........... H01L 21/28568; H01L 21/3065; H01L 21/31; H01L 21/32136; H01L 21/32139;
(Continued)

(56) References Cited

U.S. PATENT DOCUMENTS 9,601,341 B2 3/2017 Ashraf
9,896,770 B2 2/2018 Schmiege et al.
(Continued)

FOREIGN PATENT DOCUMENTS

JP 2016105465 A 6/2016

OTHER PUBLICATIONS

K.J. Kanarik et al., "Overview of Atomic Layer Etching in the Semiconductor Industry," Journal of Vacuum Science & Technology A, Mar./Apr. 2015, 14 pages, vol. 33, No. 2.
(Continued)

*Primary Examiner* — Eduardo A Rodela
*Assistant Examiner* — Christopher M Roland
(74) *Attorney, Agent, or Firm* — Robert Sullivan; Ryan, Mason & Lewis, LLP

(57) ABSTRACT

A method for etching a poly-granular metal-based film includes providing a flow of a background gas in a plasma etching chamber containing a semiconductor structure including the poly-granular metal-based film formed over a substrate with a mask patterned over the poly-granular metal-based film. The method also includes applying a source power to generate a background plasma from the background gas, and providing a flow of a modifying gas while maintaining the flow of the background gas to generate a modifying plasma that produces a surface modification region with a substantially uniform depth in the top surface of the poly-granular metal-based film exposed by the mask. The method further includes stopping the flow of the modifying gas while maintaining the flow of the background gas, and applying a biasing power to the substrate to remove the surface modification region.

20 Claims, 9 Drawing Sheets

(51) Int. Cl.
| | |
|---|---|
| *H01L 21/3065* | (2006.01) |
| *H01L 21/31* | (2006.01) |
| *H01L 21/67* | (2006.01) |
| *H01L 29/40* | (2006.01) |
| *H01L 21/768* | (2006.01) |

(52) U.S. Cl.
CPC ........ *H01L 21/67069* (2013.01); *H01L 29/40* (2013.01); *H01L 29/401* (2013.01); *H01L 21/3065* (2013.01); *H01L 21/31* (2013.01); *H01L 21/76856* (2013.01)

(58) Field of Classification Search
CPC .. H01L 21/76856; H01L 29/40; H01L 29/401
See application file for complete search history.

(56) References Cited

U.S. PATENT DOCUMENTS

| | | | |
|---|---|---|---|
| 9,960,052 | B2 | 5/2018 | Agarwal et al. |
| 10,062,576 | B2 | 8/2018 | Launay et al. |
| 2004/0222185 | A1 | 11/2004 | Kawai |
| 2005/0221021 | A1* | 10/2005 | Strang ............... H01J 37/32082 427/569 |
| 2013/0270227 | A1 | 10/2013 | Guha et al. |
| 2018/0122650 | A1* | 5/2018 | Ma .................... H01J 37/32422 |
| 2019/0108982 | A1* | 4/2019 | Yang ................. H01L 21/32137 |
| 2019/0318937 | A1* | 10/2019 | Yang ..................... H01J 37/321 |

OTHER PUBLICATIONS

G.S. Oehrlein et al., "Atomic Layer Etching at the Tipping Point: An Overview," ECS Journal of Solid State Science and Technology, Mar. 27, 2015, pp. N5041-N5053, vol. 4, No. 6.

S.U. Engelmann et al., "Challenges of Tailoring Surface Chemistry and Plasma/Surface Interactions to Advance Atomic Layer Etching," ECS Journal of Solid State Science and Technology, Apr. 2015, pp. N5054-N5060, vol. 4, No. 6.

S.D. Athavale et al., "Realization of Atomic Layer Etching of Silicon," Journal of Vacuum Science & Technology B, Nov./Dec. 1996, pp. 3702-3705, vol. 14, No. 6.

D. Metzler et al., "Fluorocarbon Assisted Atomic Layer Etching of SiO2 and Si Using Cyclic Ar/C4F8 and Ar/CHF3 Plasma," Journal of Vacuum Science & Technology A, Mar./Apr. 2014, 4 pages, vol. 32, No. 2.

J.B. Park et al., "Atomic Layer Etching of Ultra-Thin HfO2 Film for Gate Oxide in MOSFET Devices," Journal of Physics D: Applied Physics, Feb. 5, 2009, 5 pages, vol. 42, No. 5.

L. Gatilova et al., "Investigation of InP Etching Mechanisms in a Cl2/H2 Inductively Coupled Plasma by Optical Emission Spectroscopy," Journal of Vacuum Science & Technology A, Mar./Apr. 2009, pp. 262-275, vol. 27, No. 2.

K.J. Kanarik et al., "Predicting Synergy in Atomic Layer Etching," Journal of Vacuum Science & Technology A, Sep./Oct. 2017, 7 pages, vol. 35, No. 5.

Y. Lee et al., "Selectively in Thermal Atomic Layer Etching Using Sequential, Self-Limiting Fluorination and Ligand-Exchange Reactions," Chemistry of Materials, 2016, pp. 7657-7665, vol. 28.

C. Li et al., "Fluorocarbon Based Atomic Layer Etching of Si3N4 and Etching Selectivity of SiO2 Over Si3N4," Journal of Vacuum Science & Technology A, Jul./Aug. 2016, 12 pages, vol. 34, No. 4.

A. Ranjan et al., "Implementation of Atomic Layer Etching of Silicon: Scaling Parameters, Feasibility, and Profile Control," Journal of Vacuum Science & Technology A, May/Jun. 2016, 13 pages, vol. 34, No. 3.

N.D. Altieri et al., "Review Article: Plasma-Surface Interactions at the Atomic Scale for Pattering Metals," Journal of Vacuum Science & Technology A, Sep./Oct. 2017, 12 pages, vol. 35, No. 5.

B. Wu et al., "High Aspect Ratio Silicon Etch: A Review," Journal of Applied Physics, Jul. 12, 2010, 20 pages, vol. 108.

Rikka L. Puurunen, "Surface Chemistry of Atomic Layer Deposition: A Case Study for the Trimethylaluminum/Water Process," Journal of Applied Physics, Apr. 8, 2005, 52 pages, vol. 97.

J.K.-C. Chen et al., "Ion Beam Assisted Organic Chemical Vapor Etch of Magnetic Thin Films Editors-Pick," Journal of Vacuum Science & Technology A, May/Jun. 2017, 7 pages, vol. 35, No. 3.

T. Kim et al., "Viable Chemical Approach for Patterning Nanoscale Magnetoresistive Random Access Memory," Journal of Vacuum Science & Technlogy A, Mar./Apr. 2015, 6 pages, vol. 33, No. 2.

N. Marchack et al., "Cyclic Cl2/H2 Quasi-Atomic Layer Etching Approach for TiN and TaN Patterning Using Organic Masks," Journal of Vacuum Science & Technology A: Vacuum, Surfaces, and Films, Sep. 2017, 24 pages, vol. 35, No. 5.

* cited by examiner

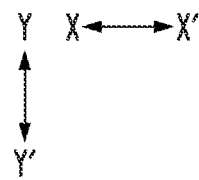
*FIG. 1* (Prior Art)
100
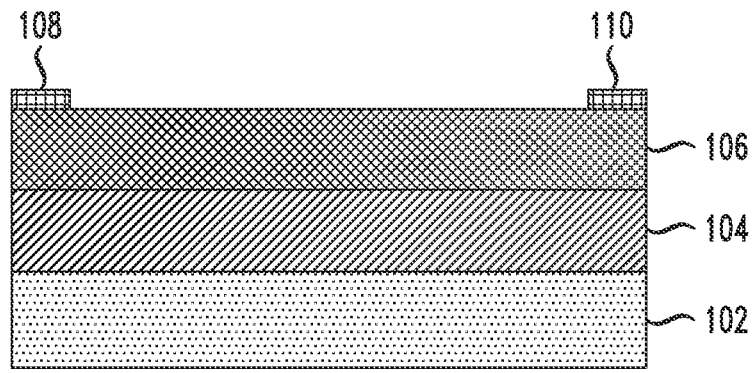
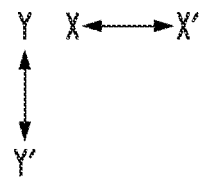
*FIG. 2* (Prior Art)
200
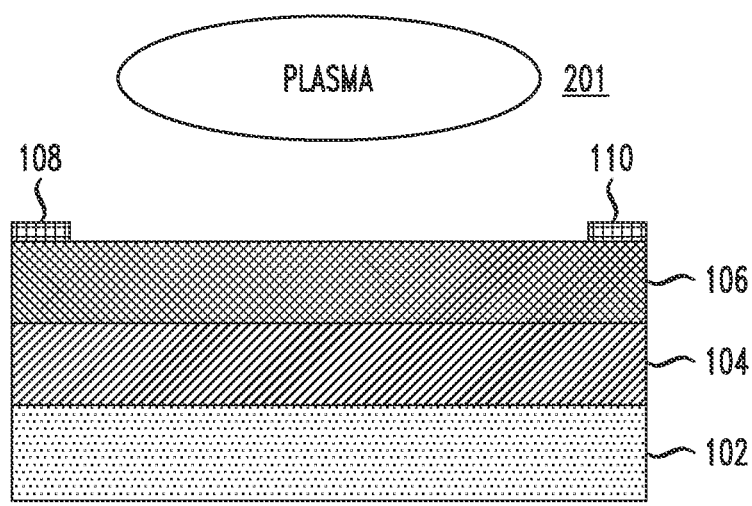

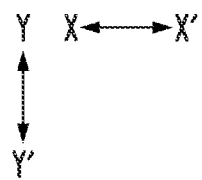
FIG. 3 (Prior Art)
300
TURN OFF RF POWER TO CHAMBER AFTER $\Delta T_{CW}$
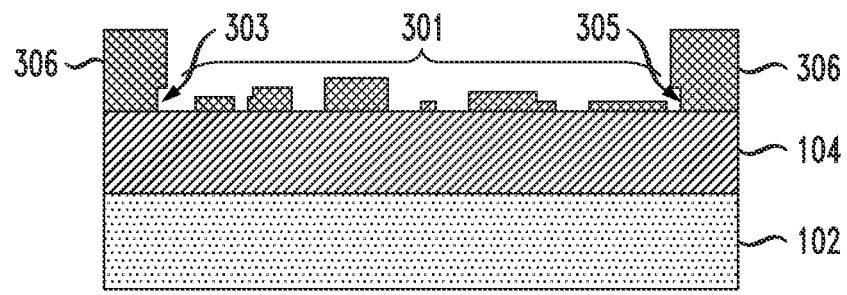
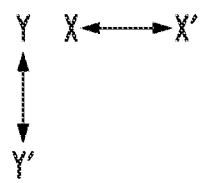
FIG. 4
400
APPLY RF POWER TO CHAMBER
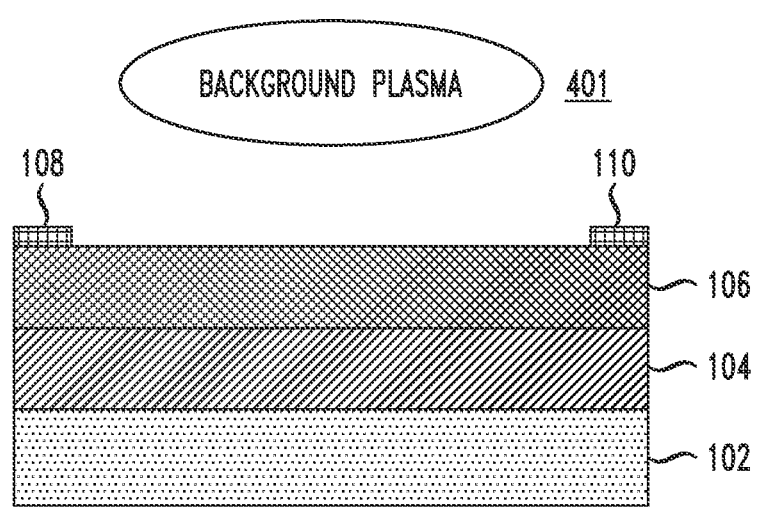

500

600

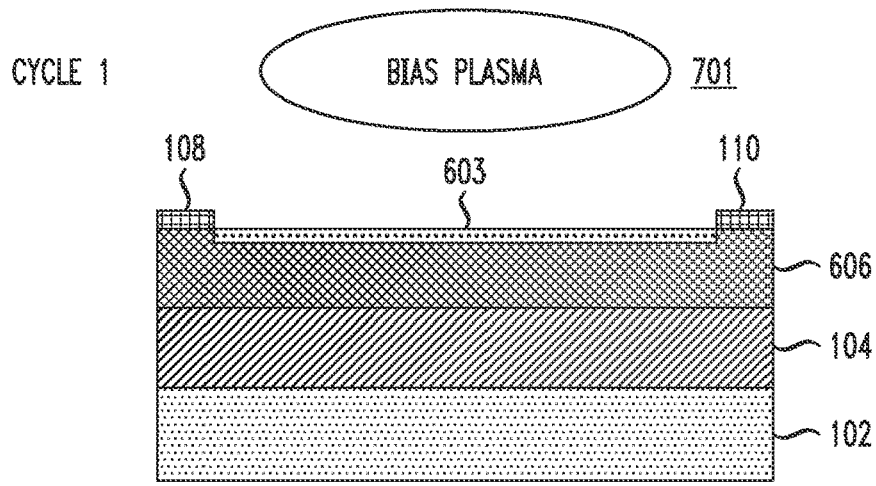
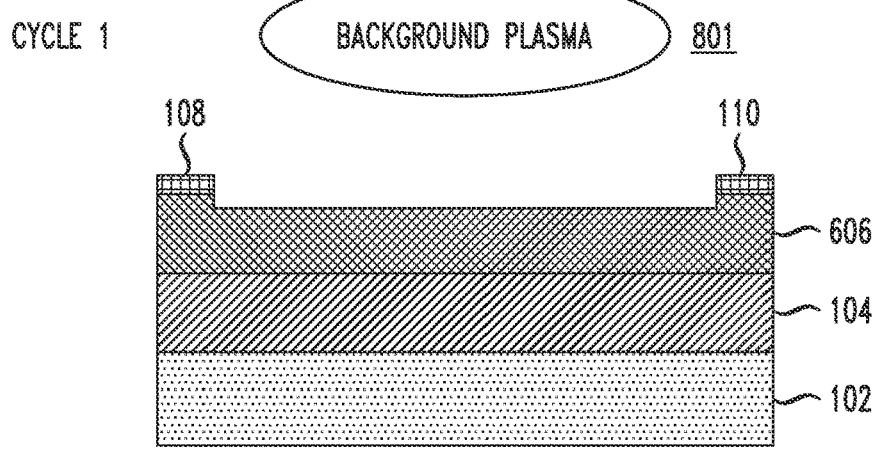

900

1000

1100

APPLY BIAS POWER TO SUBSTRATE

1200

TURN OFF BIAS POWER TO SUBSTRATE
(AND OPT. PURGE CHAMBER)

1300

1400

1500

APPLY BIAS POWER TO SUBSTRATE

1600

TURN OFF BIAS POWER TO SUBSTRATE AND RF POWER

LAYER-BY-LAYER ETCHING OF POLY-GRANULAR METAL-BASED MATERIALS FOR SEMICONDUCTOR STRUCTURES

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater number of structural features for a given chip size. Miniaturization, in general, allows for increased performance at lower power levels and lower cost. Present technology is at or approaching atomic level scaling (sub-10 nanometer (nm) node resolution) of certain devices such as logic gates, field-effect transistors (FETs), and capacitors. Such devices are used in a variety of applications including, but not limited to, non-volatile memory applications. However, as design of semiconductor structures at an atomic level progresses, fabrication processes such as etching present significant challenges.

SUMMARY

Embodiments of the invention provide techniques for layer-by-layer etching of poly-granular metal-based materials for semiconductor structures.

In one embodiment, a method for etching a poly-granular metal-based film comprises providing a flow of a background gas in a plasma etching chamber containing a semiconductor structure, the semiconductor structure comprising the poly-granular metal-based film formed over a substrate, at least one mask being patterned over a top surface of the poly-granular metal-based film. The method also comprises applying a source power to the plasma etching chamber to generate a background plasma from the background gas, and providing a flow of a modifying gas in the plasma etching chamber while maintaining the flow of the background gas to generate a modifying plasma that produces a surface modification region with a substantially uniform depth in the top surface of the poly-granular metal-based film that is exposed by the at least one mask. The method further comprises stopping the flow of the modifying gas while maintaining the flow of the background gas in the plasma etching chamber, and applying a biasing power to the substrate to remove the surface modification region from the top surface of the poly-granular metal-based film that is exposed by the at least one mask.

In another embodiment, a method of forming a semiconductor structure comprises forming a poly-granular metal-based film over a substrate, forming at least one mask over at least a portion of a top surface of the poly-granular metal-based film, forming a surface modification region in a portion of the top surface of the poly-granular metal-based film exposed by the at least one mask via application of a modifying plasma in a chamber of a plasma etching system containing the semiconductor structure, and removing the surface modification region via application of a biasing plasma in the chamber of the plasma etching system while applying a bias power to the substrate. A depth of the surface modification region is substantially uniform such that a top surface of the poly-granular metal-based film following removal of the surface modification region is substantially planar.

In another embodiment, a semiconductor structure comprises a substrate, a poly-granular metal-based film disposed over a top surface of the substrate, at least one mask patterned over a top surface of the poly-granular metal-based film, and a surface modification region in a portion of the top surface of the poly-granular metal-based film exposed by the at least one mask. The surface modification region comprises a halogen-based chemistry formed via application of a modifying plasma in a chamber of a plasma etching system. The surface modification region has a substantially uniform depth in the top surface of the poly-granular metal-based film exposed by the at least one mask.

BRIEF DESCRIPTION OF THE DRAWINGS

FIG. 1 depicts a cross-sectional side view of a semiconductor structure following formation of a metal-based film on a semiconductor layer, according to an illustrative embodiment.

FIG. 2 depicts a cross-sectional side view of the FIG. 1 structure following application of radio frequency power in a chamber during a continuous-wave plasma etching process, according to an illustrative embodiment.

FIG. 3 depicts a cross-sectional side view of the FIG. 2 structure following continuous-wave plasma etching of the metal-based film, according to an illustrative embodiment.

FIG. 4 depicts a cross-sectional side view of the FIG. 1 structure following application of radio frequency power in a chamber during a layer-by-layer plasma etching process, according to an illustrative embodiment.

FIG. 7 depicts a cross-sectional side view of the FIG. 6 with application of bias power during the first cycle of the layer-by-layer plasma etching process, according to an illustrative embodiment.

FIG. 8 depicts a cross-sectional side view of the FIG. 7 structure with the modified top portion of the metal-based film removed following the application of the bias power during the first cycle of the layer-by-layer plasma etching process, according to an illustrative embodiment.

DETAILED DESCRIPTION

Figure 5:
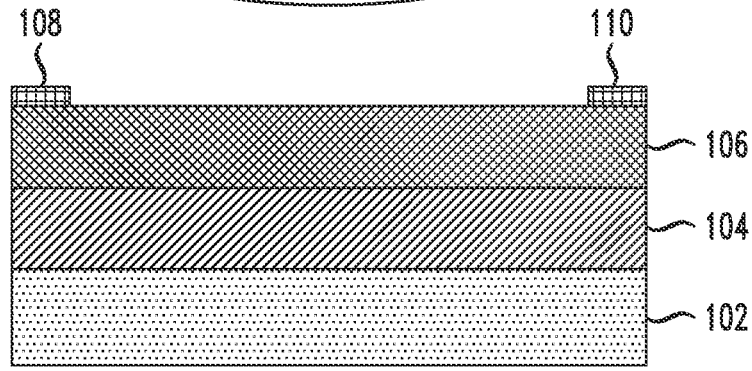
FIG. 5 depicts a cross-sectional side view of the FIG. 4 structure following application of a modifying plasma during a first cycle of the layer-by-layer plasma etching process, according to an illustrative embodiment.

Illustrative embodiments of the invention may be described herein in the context of illustrative methods for layer-by-layer etching of metal-based material in semiconductor structures along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

In some technologies, films with finely controlled crystal grains are required. Plasma etching of these films may be used to pattern these films to form desired structures. In some cases, it is desired to etch metals (e.g., titanium (Ti), tantalum (Ta), etc.) and metal nitrides (e.g., titanium nitride (TiN), tantalum nitride (TaN), etc.) in a planar or pseudo-planar fashion whereby an etch front proceeds from the material surface onward until the etch is stopped. Metal or metal nitride etching may be completed using continuous wave or constant wave (CW) plasma etching processes, where plasma conditions exist under fixed powers, pressures and gas flows. In such CW plasma etching processes, however, it can be difficult to control the etch rate of a granular film due to the non-uniform distribution of impurities and grain size in the film. As a result, such CW plasma etching processes do not proceed in a planar fashion and instead show preference to etching at the grain boundaries of the film being etched. In addition, it is difficult to control undercut in such CW plasma etching processes. Further, such CW plasma etching processes may produce or result in metal-containing residues.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures will not be repeated for each of the figures. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as ±5%, preferably less than 2% or 1% or less than the stated amount.

To provide spatial context to the different structural orientations of the semiconductor structures shown throughout the figures, XY Cartesian coordinates are shown in each of the figures. The terms "horizontal," or "horizontal direction," or "lateral direction" as used herein denote an X-direction of the Cartesian coordinates shown in the figures, the terms "vertical" or "vertical direction" or "vertical height" as used herein denote a Y-direction of the Cartesian coordinates shown in the figures. It is to be understood that assignment of the X-direction, or Y-direction to any particular direction in the figures is arbitrary.

FIG. 1 depicts a cross-sectional side view 100 of a semiconductor structure, including a bulk substrate 102, a semiconductor layer 104, a metal-based film 106, and masks 108 and 110 patterned over a top surface of the metal-based film 106. The bulk substrate 102 may be formed of any suitable material, such as silicon (Si), silicon oxide ($SiO_x$), glass a silicon-on-insulator (SOI), sapphire, etc. The height or vertical thickness of the bulk substrate 102 (in direction Y-Y') may vary as desired.

The semiconductor layer 104 is an optional layer, which may be formed of $SiO_x$ or various other materials. In some embodiments, the semiconductor layer 104 may be omitted and the metal-based film 106 may be formed directly on the substrate 102. In other embodiments, the semiconductor layer 104 may be a highly complex multi-level build of multiple (e.g., dozens) of layers, such as layers of an magnetoresistive random-access memory (MRAM) stack, a resistive random-access memory (ReRAM) stack, a phase change memory (PCM) stack, etc. The height or vertical thickness of the semiconductor layer 104 (in direction Y-Y') may be in the range of 0 to 5 micrometers (μm), depending on the type and complexity of the build.

The metal-based film 106 may be a metal (e.g., Ti, Ta, etc.) or a metal nitride (e.g., TiN, TaN, etc.). The metal-based film 106 may be formed using various processes, including but not limited to using an atomic layer deposition (ALD) process, a chemical vapor deposition (CVD) process, a plasma-enhanced CVD (PECVD) process, a low pressure CVD (LPCVD) process, a room temperature CVD (RT-CVD) process, evaporation, etc. In some embodiments, the layer-by-layer etching processes described herein are used to pattern etch-resistant metals such as TiN and TaN.

The term "etch-resistant" is used to indicate that the metal-based film 106 does not etch homogeneously. Etch-resistant metals such as crystalline or poly-granular TiN and TaN do not etch smoothly (as described in further detail below with respect to FIG. 3). Depositing a granular metallic film with a uniform grain size over the entire wafer or underlying substrate is very difficult. For example, due to the local distribution of temperature and precursor gas flows, metallic films such as metal-based film 106 are poly-granular. In a CW etch process, it is difficult to control a uniform etch rate over the distributed grain size of the metal-based film 106. Using the techniques described herein that provide self-limited etch behavior through cyclic etching, embodiments are advantageously able to achieve a uniform etch rate across the structure. The metal-based film 106 is thus also referred to as a poly-granular metal-based film 106. Using the techniques described herein, such poly-granular metal-based films such as film 106 may be smoothly etched (e.g., to form stepped structures and other types of features as will be described in further detail below, as well as for etching through the entire film).

The poly-granular metal-based film 106 may be used for various types of non-volatile memory applications, including MRAM, ReRAM, PCM, etc. In these and other applications, TiN and TaN may be used as a hard mask for patterning etch-resistant metals, while also doubling as the top electrode in memory cells (e.g., MRAM cells) due to their conductive nature. It should be appreciated, however, that the layer-by-layer etching processes described herein may be used to pattern the poly-granular metal-based film 106 (e.g., formed of Ti, Ta, TiN, TaN or another suitable metal or metal nitride material) for a wide variety of other applications. The height or vertical thickness (in direction Y-Y') of the poly-granular metal-based film 106 may be in the range of a few nanometers (nm) to 500 nm.

Masks 108 and 110 are patterned over the top surface of the metal-based film 106 as illustrated in FIG. 1. The masks 108 and 110 may be formed using any suitable process, including but not limited to lithography and etching. The masks 108 and 110 may be photoresist layers, a hard mask such as $SiO_x$ or silicon nitride (SiN), an organic planarization layer (OPL), an OPL plus a silicon-containing antireflective coating (SiARC) layer, another metal that is resistant to the desired etch process used to etch the poly-granular metal-based film 106, combinations thereof, etc. The height or vertical thickness (in direction Y-Y') of the masks 108 and 110 may be between 0 and 40 µm, between 200 and 300 nm, etc.

Plasma etching processes generally involve the application of plasma of an appropriate gas, within a chamber, to a material to be etched. The plasma can be charged (e.g., ions), neutral (e.g., atoms and radicals), or combinations thereof. During the plasma etching process, the plasma generates volatile etch products from the chemical reactions between elements of the material to be etched and the reactive species generated by the plasma.

FIG. 2 depicts a cross-sectional side view 200 of the FIG. 1 structure, following application of radio frequency (RF) power to the background gas in the plasma etching chamber which strikes the plasma. The background gas is introduced, and once gas flow and pressure within the chamber are stabilized, the RF power is applied to the chamber to create (e.g., strike) the plasma 201.

In CW plasma etching, the RF power is left on and plasma 201 is constantly present for a prescribed amount of time, denoted as $\Delta T_{CW}$, such that the plasma 201 etches the top surface of the poly-granular metal-based film 106 that is exposed between masks 108 and 110.

FIG. 3 depicts a cross-sectional side view 300 of a semiconductor structure following CW plasma etching of the poly-granular metal-based film 106. As illustrated in FIG. 3, the CW plasma etching results in undesirable metal containing residues 301 in the area between the masks 108 and 110, as well as undercuts 303 and 305 into the permanent structures 306 (e.g., the remaining portion of the poly-granular metal-based film 106 that is below the masks 108 and 110 following the CW plasma etching process).

The residues 301 may be a result of etching at the grain boundaries of the poly-granular metal-based film 106. As noted above, metal and metal nitride films may have grain boundaries which etch at different rates than the bulk material in an etch process such as the CW plasma etching process.

Illustrative embodiments provide techniques for smooth layer-by-layer etching of metal and metal nitride films, including poly-granular metal and metal nitride films. Advantageously, illustrative embodiments avoid the etching at grain boundaries illustrated in FIG. 3 above, which results in residues 301 and undercuts 303 and 305. Thus, some embodiments provide a uniform etch rate that avoids the different kinetics found at the grain boundaries of the poly-granular metal-based film 106.

Some embodiments utilize a cyclic etch process that provides a uniform etch with a planar or semi-planar etch front suitable for etching fine-grained polycrystalline metal and metal nitride films. In such cyclic etch processes, undercut in the permanent structures can be highly controlled, and residues are reduced to zero. Further, the smooth planar etch front allows for the formation of stepped structures and other types of features in the poly-granular metal-based film 106. The cyclic etch processes in some embodiments eliminate the ground-boundary preference shown in the CW plasma etching process described above, and thus avoid the uneven or bumpy etching provided by the CW-type plasma etching process.

Illustrative cyclic etching processes for layer-by-layer etching of the poly-granular metal-based film 106 will now be described with respect to FIGS. 4-16.

FIG. 4 depicts a cross-sectional side view 400 of the FIG. 1 structure, following the application of RF power to a chamber containing the structure. This RF power is referred to herein as a "source" power, and may be applied at the top of the chamber containing the FIG. 4 structure. The source power may be between 50 and 2500 Watts (W), and in some embodiments is preferably in the range of 100 to 500 W. The source power may be maintained throughout the process of FIGS. 4-17.

In some embodiments, a background plasma 401 is maintained throughout the process, and may include a stable gas such as nitrogen ($N_2$), a noble gas (e.g., helium (He), argon (Ar), etc.). The flow rate of the background gas providing the background plasma 401 may be between 0 and 500 cubic centimeters per minute (ccm), and in some embodiments is preferably in the range of 100 to 300 ccm. In some cases, a noble gas such as He or Ar is preferred for use as the background plasma 401. The pressure of the chamber containing the FIG. 4 structure may be in the range of 0 to 100 milliTorr (mTorr), and in some embodiments is preferably in the range of 4 to 45 mTorr.

The temperature of the substrate 102, also referred to herein as the temperature of the chuck, may be maintained constant through the process, such as in the range between −100 and +300 degrees Celsius (° C.). In some embodiments, the temperature is preferably kept close to room temperature.

The application of the RF power to the chamber containing the FIG. 4 structure creates the background plasma 401 from the background gas that is introduced to the chamber.

FIG. 5 depicts a cross-sectional side view 500 of the FIG. 4 structure at initiation of a first cycle of the layer-by-layer etch process, whereby a modifying gas is introduced to the chamber (while the background gas flow is maintained), such that a modifying plasma 501 is provided in the chamber. In some embodiments, the modifying gas may be provided to the chamber at a flow rate in the range of 0 to 300 ccm, and in some embodiments is preferably approximately 100 ccm. The modifying gas in some embodiments generates a halogen-based surface modification chemistry (e.g., in modified portion 603 of the poly-granular metal-based film 106 as will be described in further detail below). The modifying gas may be a halogen gas such as chlorine ($Cl_2$), sulfur hexafluoride ($SF_6$), tetrafluoromethane ($CF_4$), etc. In other embodiments, the modifying gas may include hydrogen ($H_2$).

Figure 6:
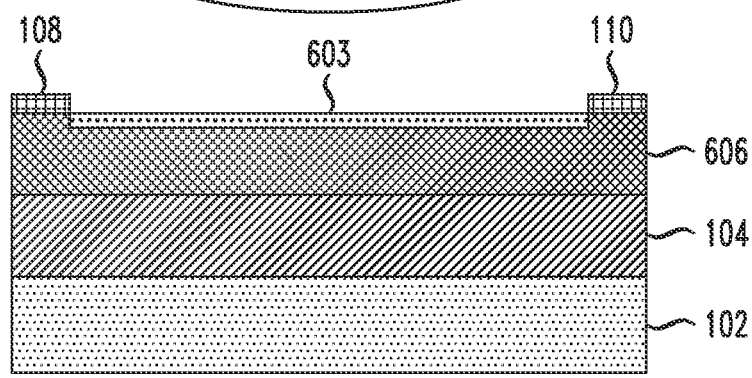
FIG. 6 depicts a cross-sectional side view of the FIG. 5 structure with a modified top portion of the metal-based film following the application of the modifying gas during the first cycle of the layer-by-layer plasma etching process, according to an illustrative embodiment.

FIG. 6 depicts a cross-sectional side view 600 of the FIG. 5 structure, after the flow of the modifying gas is turned off but the background gas is still applied (e.g., such that background plasma 601 is present in the chamber). The time period in which the modifying plasma 501 is applied to the chamber is referred to herein as a "surface modification" time period, which may last between 0 and 240 seconds(s), and in some embodiments is preferably less than 10 s. The surface modification results in the formation of a modified portion 603 of the poly-granular metal-based film 106. The thickness of the modified portion 603 may vary, such as between 0 and 30 nm per cycle. In FIG. 6, the poly-granular metal-based film 106 is re-labeled as poly-granular metal-based film 606 to reflect the fact that a portion of the poly-granular metal-based film 106 has been transformed to the modified portion 603 through surface adsorption of the modifying plasma 501 during the surface modification time period.

The FIG. 6 structure may undergo an optional chamber purging step, wherein the modifying gas is removed or purged from the chamber. The purging may be accomplished by stopping the flow of the modifying gas and waiting some designated amount of time. During this time, the background gas flow remains, and the chemistry of the plasma changes over time (e.g., from Ar plus $Cl_2$ back to just Ar) at which point background plasma 601 is present in the chamber. The background plasma 601 may have a composition similar to that of background plasma 401. The chamber purging may last between 0 and 10 minutes (min), and in some embodiments is preferably less than 2 min.

FIG. 7 depicts a cross-sectional side view 700 of the FIG. 6 structure after application of a bias power in the chamber. The bias power is applied to the substrate 102, and helps with the etching of the modified portion 603. The bias power may be between 0 and 2000 W, and in some embodiments is preferably in the range of 10 to 100 W. The bias power may be applied for a duration between 0 and 90 s, and in some embodiments is preferably less than 10 s. During application of the bias power, "bias" plasma 701 is present in the chamber. The term "bias plasma" is used to refer to the background plasma that is present during the application of bias power. In some embodiments, the bias plasma 701 has a composition similar to the background plasma 401/601. In other embodiments, additional gas chemistries may be introduced at this step along with the background gas to provide bias plasma 701. The additional gas may be one that interacts with the chemistry of the surface modification region. For example, as noted above the modifying gas may be a halogen gas that produces the surface modification region 603 with a halogen-based chemistry. In these and other embodiments, the additional gas may comprise hydrogen ($H_2$).

FIG. 8 depicts a cross-sectional side view 800 of the FIG. 7 structure following etching of the modified portion 603, where the bias power to the substrate 102 is turned off. At this point, an optional purging of the chamber may occur. This purging may follow processing similar to that described above with respect to FIG. 6. After the optional purging, background plasma 801 is present in the chamber. The background plasma 801 may have a composition similar to that of background plasma 401/601. FIG. 8 represents the end of the first cycle of the layer-by-layer etching process. As a result of the first cycle, the poly-granular metal-based film 106 is etched in the regions exposed between the masks 108 and 110 resulting in poly-granular metal-based film 606, which is thinner in the region between the masks 108 and 110 than below the masks 108 and 110.

Advantageously, the etching of the poly-granular metal-based film 106 is "smooth" such that a top surface of the poly-granular metal-based film 606 between the masks 108 and 110 is planar or substantially planar. By substantially planar, it is meant that the surface variation is less than 5 nm. In some embodiments, the surface variation is preferably less than 2 nm or on the order of 1 to 3 atomic layers. This smooth etching also forms a distinct stepped structure or feature in the poly-granular metal-based film 606 at the area between the masks 108 and 110 and the regions covered by the masks 108 and 110.

The cycle 1 process described above with respect to FIGS. 5-8 may be repeated as desired to provide further layer-by-layer etching of the poly-granular metal-based film 606. FIGS. 9-12 depict cycle 2, and FIGS. 13-16 depict an nth cycle.

Figure 9:
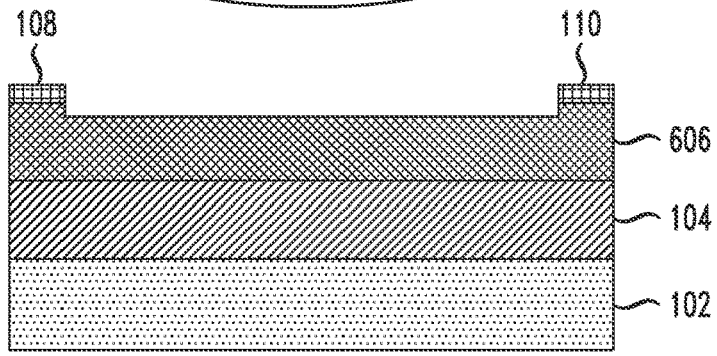
FIG. 9 depicts a cross-sectional side view of the FIG. 8 structure following application of a modifying gas during a second cycle of the layer-by-layer plasma etching process, according to an illustrative embodiment.

FIG. 9 depicts a cross-sectional side view 900 of the FIG. 8 structure following initiation of a second cycle of the layer-by-layer etch process. Similar to FIG. 5, a modifying gas is introduced to the chamber such that modifying plasma 901 with a composition similar to that of modifying plasma 501 is provided. The modifying gas and its associated flow rate may be similar to that used for the first cycle described above with respect to FIG. 5.

Figure 10:
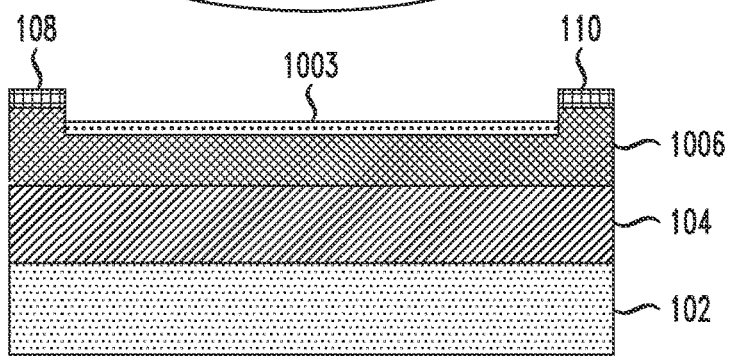
FIG. 10 depicts a cross-sectional side view of the FIG. 9 structure with a modified top portion of the metal-based film following application of the modifying gas during the second cycle of the layer-by-layer plasma etching process, according to an illustrative embodiment.

FIG. 10 depicts a cross-sectional side view 1000 of the FIG. 9 structure after the flow of the modifying gas is turned off (e.g., after a surface modification time period which may be similar to the length used in the first cycle). The surface modification results in the formation of a modified portion 1003 of the poly-granular metal-based film 606. The modified portion 1003 may have a thickness similar to that of the modified portion 603 described above with respect to the first cycle. In FIG. 10, the poly-granular metal-based film 606 is re-labeled as poly-granular metal-based film 1006 to reflect that fact that a portion of the poly-granular metal-based film 606 has been transformed to the modified portion 1003 through surface adsorption of the modifying plasma 901 during the surface modification time period.

The FIG. 10 structure, similar to the FIG. 6 structure, may undergo an optional chamber purging step, wherein the modifying gas is removed or purged from the chamber, followed by re-introduction of background plasma 1001, which may have a composition similar to that of background plasma 401/601. The length of the chamber purging may be similar to that used during the first cycle.

Figure 11:
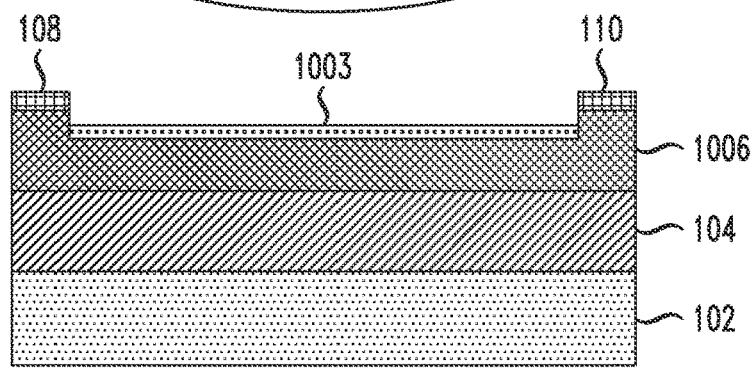
FIG. 11 depicts a cross-sectional side view of the FIG. 10 structure with application of bias power during the second cycle of the layer-by-layer plasma etching process, according to an illustrative embodiment.

FIG. 11 depicts a cross-sectional side view 1100 of the FIG. 10 structure after application of bias power in the chamber. The bias power is applied to the substrate 102 to assist with etching of the modified portion 1003. The amount of the bias power and the duration for which the bias power is applied may be similar to that used for the first cycle. During application of the bias power, bias plasma 1101 is present in the chamber. The bias plasma 1101 may have a composition similar to that of bias plasma 701.

Figure 12:
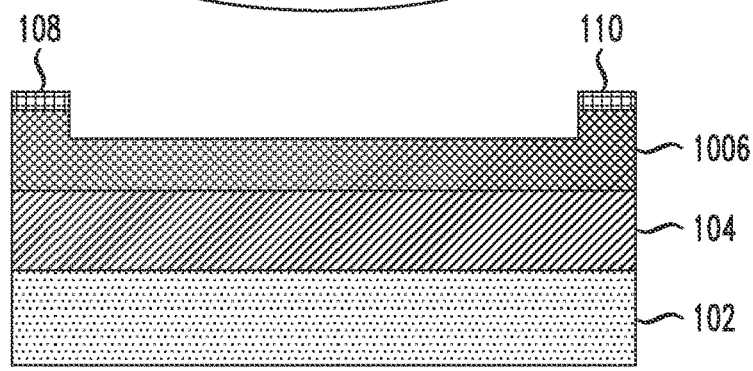
FIG. 12 depicts a cross-sectional side view of the FIG. 11 structure with the modified top portion of the metal-based film removed following the application of the bias power during the second cycle of the layer-by-layer plasma etching process, according to an illustrative embodiment.

FIG. 12 depicts a cross-sectional side view 1200 of the FIG. 11 structure following etching of the modified portion 1003, where the bias power to the substrate 102 is turned off. At this point, an optional purging of the chamber may occur. After the optional purging, background plasma 1201 is present in the chamber. The background plasma 1201 may have a composition similar to that of background plasma 401/601/801/1001. FIG. 12 represents the end of the second cycle of the layer-by-layer etching process. As a result of the second cycle, the poly-granular metal-based film 606 is etched in the regions exposed between the masks 108 and 110 resulting in poly-granular metal-based film 1006, which is thinner in the region between the masks 108 and 110 (relative to poly-granular metal-based film 606) than below the masks 108 and 110.

The FIG. 12 structure may be subject to a number of additional cycles of the layer-by-layer etching process so as to remove a desired amount of the poly-granular metal-based film 1006 that remains in the region between the masks 108 and 110. In some embodiments, a number of additional cycles are performed until there is no amount of the poly-granular metal-based film 1006 in the region between the masks 108 and 110 (e.g., the poly-granular metal-based film remains only in the regions below the masks 108 and 110). FIGS. 13-16 depict an nth cycle, where "n" represents the number of cycles required to fully remove portions of the poly-granular metal-based film 106 in the region between the masks 108 and 110.

Figure 13:
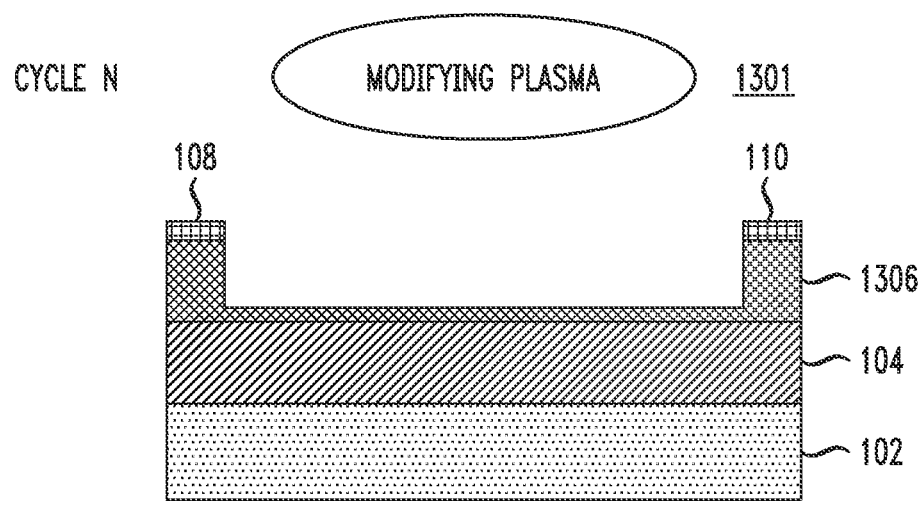
FIG. 13 depicts a cross-sectional side view of the FIG. 12 structure following application of a modifying gas during an nth cycle of the layer-by-layer plasma etching process, according to an illustrative embodiment.

FIG. 13 depicts a cross-sectional side view 1300 of the FIG. 12 structure following the (n−1)th cycle of the layer-by-layer etch process, where a poly-granular metal-based film 1306 remains. The thickness of the poly-granular metal-based film 1306 between the masks 108 and 110 is assumed to be an amount which may be fully removed following the nth cycle of the layer-by-layer etch process. The FIG. 13 structure is in the chamber following initiation of the nth cycle of the layer-by-layer etch process. Similar to FIGS. 5 and 9, a modifying gas is introduced to the chamber such that modifying plasma 1301 is provided, where the modifying plasma 1301 may have a composition similar to that of modifying plasma 501/901. The modifying gas and its associated flow rate may be similar to that used for the first cycle described above with respect to FIG. 5.

Figure 14:
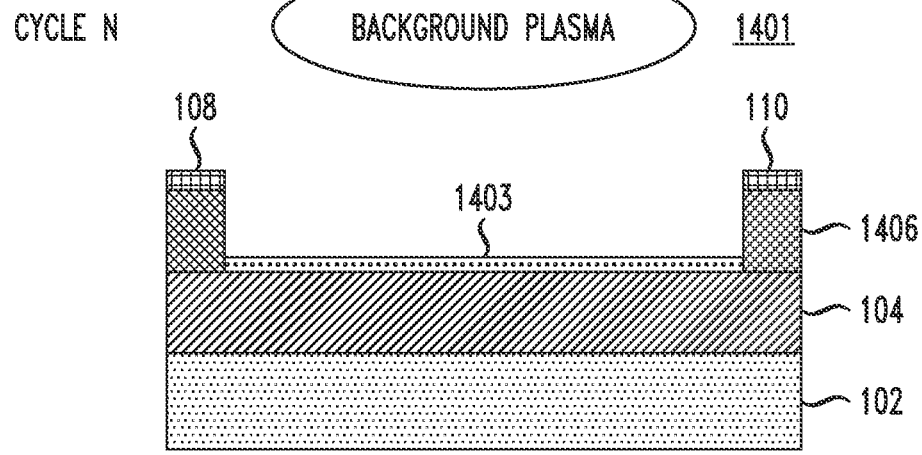
FIG. 14 depicts a cross-sectional side view of the FIG. 13 structure with a modified top portion of the metal-based film following the application of the modifying gas during the nth cycle of the layer-by-layer plasma etching process, according to an illustrative embodiment.

FIG. 14 depicts a cross-sectional side view 1400 of the FIG. 13 structure after the flow of the modifying gas is turned off (e.g., after a surface modification time period which may be similar to the length used in the first cycle). The surface modification results in the formation of a modified portion 1403 of the poly-granular metal-based film 1306. The modified portion 1403 may have a thickness similar to that of the modified portion 603 described above with respect to the first cycle, or may be a thickness of the remainder of the portion of the poly-granular metal-based film 1306 between the masks 108 and 110. In FIG. 14, the portions of the poly-granular metal-based film 1306 below the masks 108 and 110 is re-labeled as poly-granular metal-based film 1406 to reflect the fact that the remaining portion of the poly-granular metal-based film 1306 between the masks 108 and 110 has been transformed to the modified portion 1403 through surface adsorption of the modifying plasma 1301 during the surface modification time period.

The FIG. 14 structure, similar to the FIGS. 6 and 10 structures, may undergo an optional chamber purging step, wherein the modifying gas is removed and purged from the chamber, followed by re-introduction of background plasma 1401, which may have a composition similar to that of background plasma 401/601/801/1001/1201. The length of the chamber purging may be similar to that used during the first cycle.

Figure 15:
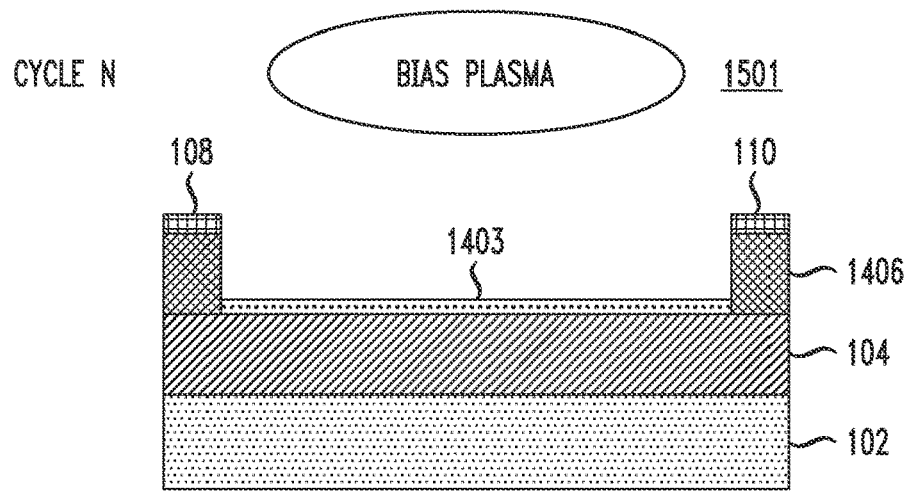
FIG. 15 depicts a cross-sectional side view of the FIG. 14 structure with application of bias power during the nth cycle of the layer-by-layer plasma etching process, according to an illustrative embodiment.

FIG. 15 depicts a cross-sectional side view 1500 of the FIG. 14 structure after application of bias power in the chamber. The bias power is applied to the substrate 102 to assist with etching of the modified portion 1403. The amount of the bias power and the duration for which the bias power is applied may be similar to that used for the first cycle. During application of the bias power, bias plasma 1501 is present in the chamber. The bias plasma 1501 may have a composition similar to that of bias plasma 701/901.

Figure 16:
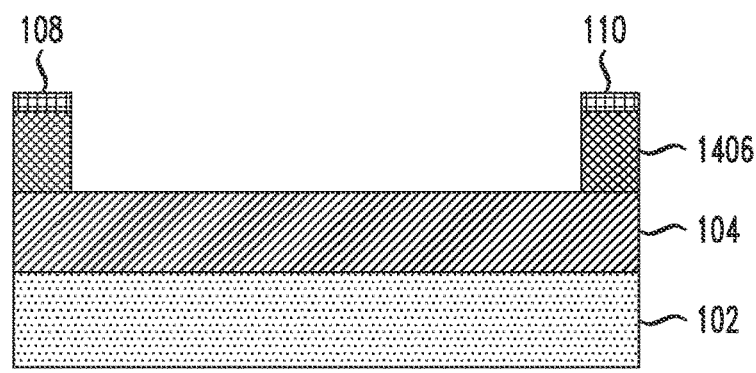
FIG. 16 depicts a cross-sectional side view of the FIG. 15 structure with the modified top portion of the metal-based film removed following the application of the bias power during the nth cycle of the layer-by-layer plasma etching process, according to an illustrative embodiment.

FIG. 16 depicts a cross-sectional side view 1600 of the FIG. 15 structure following etching of the modified portion 1403, where the bias power to the substrate 102 is turned off. The RF or source power to the chamber is also turned off, as the nth cycle is assumed to represent an end of the layer-by-layer etching process. The chamber may be optionally purged at this point, followed by changing chamber conditions to perform additional processing on the structure. The structure may also be removed from the chamber if there is no additional processing to be performed. As illustrated in FIG. 16, all portions of the poly-granular metal-based film formed between the masks 108 and 110 are removed, and the permanent structure of poly-granular metal-based film 1406 remains below the masks 108 and 110.

While the process described above with respect to FIGS. 1 and 4-16 is shown as removing portions of the poly-granular metal-based film 106 formed between two masks 108 and 110 such that two pillars of the poly-granular metal-based film 1406 remain following the nth cycle, it should be appreciated that the use of different masks may be used to form other amounts of pillars of the poly-granular metal-based film following the nth cycle. Also, masks may be added or removed from different portions of a metal-based film between cycles to form other shapes of poly-granular metal-based films (e.g., "stepped" structures) as desired for a particular application.

More generally, the layer-by-layer etching process may involve a number of cycles, where each cycle includes a surface modification step (e.g., as illustrated in FIGS. 5, 9 and 13), one or more optional purging steps (e.g., as illustrated in FIGS. 6, 10 and 14, and in FIGS. 8, 12 and 16), and one or more etching steps (e.g., as illustrated in FIGS. 7, 11 and 15). Through formation of modified portions of the poly-granular metal-based film in each cycle (e.g., modified portions 603, 1003, 1403), the layer-by-layer etch process produces a smooth (e.g., planar or substantially planar, with minimal surface variation as described above) metal or metal nitride surface after each cycle thus providing a planar or pseudo-planar etch front.

Figure 17:
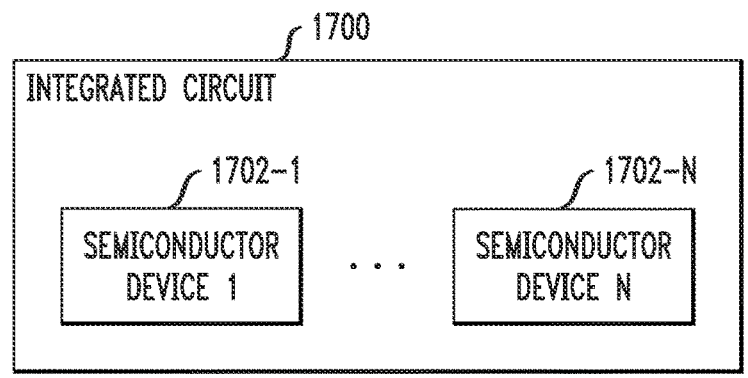
FIG. 17 depicts a block diagram of an integrated circuit with a plurality of semiconductor devices formed according to one or more illustrative embodiments.

FIG. 17 depicts a block diagram of an integrated circuit 1700 with a plurality of semiconductor devices 1702-1 through 1702-N formed according to one or more illustrative embodiments. It is to be appreciated that at least one of the semiconductor devices 1702-1 through 1702-N comprises a semiconductor structure having at least one poly-granular metal-based film layer formed by the layer-by-layer etch process described above with respect to FIGS. 1 and 4-16.

Figure 18:
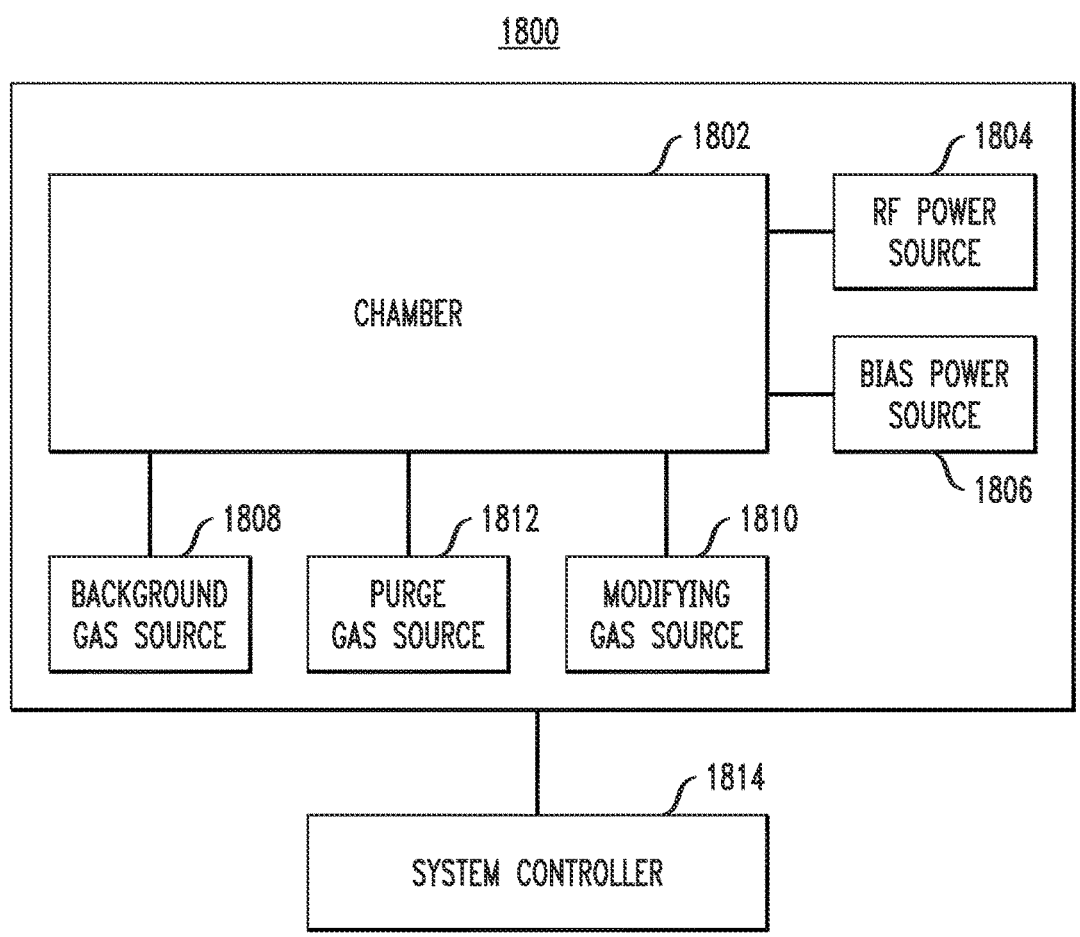
FIG. 18 depicts a block diagram of a layer-by-layer plasma etching system, according to an illustrative embodiment.

FIG. 18 depicts a block diagram of a layer-by-layer plasma etching system, according to an illustrative embodiment. In more detail, FIG. 18 schematically illustrates a plasma etching system 1800 including a chamber 1802 that further includes a mechanism for retaining a substrate (not shown) under predetermined pressure, temperature, and ambient conditions, and for selectively exposing the substrate to various gases. A background gas source 1808, modifying gas source 1810, and a purge gas source 1812, may be coupled to the chamber 1802 by conduits or other appropriate means, and may further couple to a manifold, valve control system, mass flow control system, or mechanism to control the flow from the gaseous sources. A system controller 1814 controls timing of gas pulse sequences, temperature and pressure of the substrate in the chamber, and various other operations necessary to provide proper operation of the system, including controlling an RF power source 1804 used during the plasma etch process and a bias power source 1806 (which is also an RF power source) used to bias the substrate of the target wafer.

The cyclic plasma etching process of the metal and metal nitride films begins with stabilizing the baseline gas flow and pressure within the chamber, followed by applying RF power to create the plasma as described above. In some embodiments, the chamber may utilize a halogen-chemistry based plasma (e.g., chlorine ($Cl_2$) plasma) with a background gas (e.g., a noble gas such as Ar) used to supply a background plasma for etching the metal-based film. As noted above, the RF or source power is left on throughout the process. A modifying gas (e.g., $H_2$) is flowed into the chamber, which is used to chemically modify the surface of the metal-based film. Following modification of the surface of the metal-based film, the chamber may optionally be purged of the modifying gas. Bias power is then applied to the substrate to help with etching of the modified surface. Following the etching process, the bias power is turned off, and the chamber may be optionally purged. The above procedure may be repeated a number of times, for example three to seven times or greater (e.g., 50, 100, 150, etc.), until the metal-based film is reduced to the required thickness. In some embodiments, the metal-based film may be completely removed.

In some embodiments, a method for etching a poly-granular metal-based film comprises providing a flow of a background gas in a plasma etching chamber containing a semiconductor structure, the semiconductor structure comprising the poly-granular metal-based film formed over a substrate, at least one mask being patterned over a top surface of the poly-granular metal-based film. The method also comprises applying a source power to the plasma etching chamber to generate a background plasma from the background gas, and providing a flow of a modifying gas in the plasma etching chamber while maintaining the flow of the background gas to generate a modifying plasma that produces a surface modification region with a substantially uniform depth in the top surface of the poly-granular metal-based film that is exposed by the at least one mask. The method further comprises stopping the flow of the modifying gas while maintaining the flow of the background gas in the plasma etching chamber, and applying a biasing power to the substrate to remove the surface modification region from the top surface of the poly-granular metal-based film that is exposed by the at least one mask.

The method may further comprise removing application of the biasing power and repeating the providing the flow of the modifying gas step, the stopping the flow of the modifying gas step and the applying the biasing power step until the top surface of the poly-granular metal-based film exposed by the at least one mask is etched to a desired depth.

The method may further comprise performing a purge of the plasma etching chamber prior to repeating the providing the flow of the modifying gas step.

The method may further comprise maintaining a pressure of the chamber in the range of 0 to 100 mTorr and maintaining a temperature of the substrate in the range of −100 to +300° C. The source power may be between 100 and 500 W.

A flow rate of the background gas may be between 100 and 300 ccm. The background gas may comprise at least one of $N_2$, He and Ar. A flow rate of the modifying gas may be approximately 100 ccm. The modifying plasma may be generated in the plasma etching chamber for a duration greater than 0 and less than 10 s. The modifying gas may comprise a halogen gas, the halogen gas comprising at least one of $Cl_2$, $SF_6$ and $CF_4$.

Stopping the flow of the modifying gas while maintaining the flow of the background gas in the plasma etching chamber may comprise performing a purge of the plasma etching chamber that removes the modifying gas from the plasma etching chamber. The purge of the plasma etching chamber may last for a duration greater than 0 and less than 2 minutes.

The biasing power may be between 10 and 100 W. The biasing power may be applied for a duration greater than 0 and less than 10 s. The method may further comprise providing a flow of an additional gas while applying the biasing power to the substrate, the additional gas having a chemistry that interacts with a chemistry of the surface modification region. The surface modification region may comprise a halogen-based chemistry, and the additional gas may comprise $H_2$.

In some embodiments, a method of forming a semiconductor structure comprises forming a poly-granular metal-based film over a substrate, forming at least one mask over at least a portion of a top surface of the poly-granular metal-based film, forming a surface modification region in a portion of the top surface of the poly-granular metal-based film exposed by the at least one mask via application of a modifying plasma in a chamber of a plasma etching system containing the semiconductor structure, and removing the surface modification region via application of a biasing plasma in the chamber of the plasma etching system while applying a bias power to the substrate. A depth of the surface modification region is substantially uniform such that a top surface of the poly-granular metal-based film following removal of the surface modification region is substantially planar.

The poly-granular metal-based film comprises at least one of Ta, TaN, Ti and TiN. The depth of the surface modification region may be between 0 and 30 nm.

The method may further comprise repeating the forming the surface modification region step and the removing the surface modification region step until a desired amount of the poly-granular metal-based film exposed by the at least one mask has been removed.

The modifying plasma may be generated via application of RF power to the chamber of the plasma etching system while a background gas and a modifying gas are supplied to the chamber. The background gas may comprise at least one of $N_2$ and a noble gas, the noble gas comprising at least one of He and Ar. The modifying gas may comprise a halogen gas, the halogen gas comprising at least one of $Cl_2$, $SF_6$, and $CF_4$. The biasing plasma is generated via application of RF power to the chamber while the background gas and an additional gas are supplied to the chamber, the additional gas comprising a gas that interacts with a halogen-based surface modification chemistry of the surface modification region. The additional gas may comprise $H_2$.

In some embodiments, a semiconductor structure comprises a substrate, a poly-granular metal-based film disposed over a top surface of the substrate, at least one mask patterned over a top surface of the poly-granular metal-based film, and a surface modification region in a portion of the top surface of the poly-granular metal-based film exposed by the at least one mask. The surface modification region comprises a halogen-based chemistry formed via application of a modifying plasma in a chamber of a plasma etching system. The surface modification region has a substantially uniform depth in the top surface of the poly-granular metal-based film exposed by the at least one mask.

It is to be appreciated that the various materials, processing methods (e.g., etch types, deposition types, etc.) and dimensions provided in the discussion above are presented by way of example only. Various other suitable materials, processing methods, and dimensions may be used as desired.

Semiconductor devices and methods for forming same in accordance with the above-described techniques can be employed in various applications, hardware, and/or electronic systems. Suitable hardware and systems for implementing embodiments of the invention may include, but are not limited to, sensors and sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other high level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for etching a poly-granular metal-based film, comprising:

providing a flow of a background gas in a plasma etching chamber containing a semiconductor structure, the semiconductor structure comprising the poly-granular metal-based film formed over a substrate, at least one mask being patterned over a top surface of the poly-granular metal-based film;

applying a source power to the plasma etching chamber to generate a background plasma from the background gas;

providing a flow of a modifying gas in the plasma etching chamber while maintaining the flow of the background gas to generate a modifying plasma that produces a surface modification region with a substantially uniform depth in the top surface of the poly-granular metal-based film that is exposed by the at least one mask;

performing a purge of the plasma etching chamber that removes the modifying gas from the plasma etching chamber, wherein performing the purge of the plasma etching chamber that removed the modifying gas from the plasma etching chamber comprises stopping the flow of the modifying gas while maintaining the flow of the background gas in the plasma etching chamber; and providing, subsequent to the purge of the plasma etching chamber that removes the modifying gas from the plasma etching chamber, a flow of an additional gas while applying a biasing power to the substrate to remove the surface modification region from the top surface of the poly-granular metal-based film that is exposed by the at least one mask;

wherein the modifying gas is a halogen gas, and wherein the additional gas is different than the modifying gas.

2. The method of claim 1, further comprising removing application of the biasing power and repeating the providing the flow of the modifying gas step, the performing the purge of the plasma etching chamber step and the providing the flow of the additional gas while applying the biasing power step until the top surface of the poly-granular metal-based film exposed by the at least one mask is etched to a desired depth.

3. The method of claim 2, further comprising performing a purge of the plasma etching chamber prior to repeating the providing the flow of the modifying gas step.

4. The method of claim 1, further comprising maintaining a pressure of the chamber in the range of about 0 to 100 milliTorr and maintaining a temperature of the substrate in the range of about −100 to +300 degrees Celsius.

5. The method of claim 1, wherein the source power is between about 100 and 500 Watts.

6. The method of claim 1, wherein a flow rate of the background gas is between about 100 and 300 cubic centimeters per minute, and wherein the background gas comprises at least one of nitrogen ($N_2$), helium (He) and argon (Ar).

7. The method of claim 1, wherein a flow rate of the modifying gas is approximately 100 cubic centimeters per minute, wherein the modifying plasma is generated in the plasma etching chamber for a duration greater than 0 and less than about 10 seconds, and wherein the halogen gas comprising at least one of chlorine ($Cl_2$), sulfur hexafluoride ($SF_6$) and tetrafluoromethane ($CF_4$).

8. The method of claim 1, wherein wherein the purge of the plasma etching chamber lasts for a duration greater than 0 and less than about 2 minutes.

9. The method of claim 1, wherein the biasing power is between about 10 and 100 Watts and the biasing power is applied for a duration greater than 0 and less than about 10 seconds.

10. The method of claim 1, wherein the additional gas has a chemistry that interacts with a chemistry of the surface modification region.

11. The method of claim 10, wherein the surface modification region comprises a halogen-based chemistry and the additional gas comprises hydrogen ($H_2$).

12. The method of claim 1, wherein the halogen gas comprises at least one of chlorine ($Cl_2$), sulfur hexafluoride ($SF_6$) and tetrafluoromethane ($CF_4$), and wherein the additional gas comprises hydrogen ($H_2$).

13. A method of forming a semiconductor structure, comprising:
    forming a poly-granular metal-based film over a substrate;
    forming at least one mask over at least a portion of a top surface of the poly-granular metal-based film;
    forming a surface modification region in a portion of the top surface of the poly-granular metal-based film exposed by the at least one mask via application of a modifying plasma comprising a modifying gas in a chamber of a plasma etching system containing the semiconductor structure; and
    removing the surface modification region via performing a purge of the plasma etching system that removes the modifying gas from the chamber of the plasma etching system and, subsequent to the purge of the plasma etching system that removes the modifying gas from the chamber of the plasma etching system, application of a biasing plasma comprising an additional gas in the chamber of the plasma etching system while applying a bias power to the substrate;
    wherein a depth of the surface modification region is substantially uniform such that the top surface of the poly-granular metal-based film following removal of the surface modification region is substantially planar; and
    wherein the modifying gas is a halogen gas, and wherein the additional gas is different than the modifying gas.

14. The method of claim 13, wherein the poly-granular metal-based film comprises at least one of tantalum, tantalum nitride, titanium and titanium nitride.

15. The method of claim 13, wherein the depth of the surface modification region is between about 0 and 30 nanometers.

16. The method of claim 13, further comprising repeating the forming the surface modification region step and the removing the surface modification region step until a desired amount of the poly-granular metal-based film exposed by the at least one mask has been removed.

17. The method of claim 13, wherein the modifying plasma is generated via application of radio frequency power to the chamber of the plasma etching system while a background gas and the modifying gas are supplied to the chamber.

18. The method of claim 17, wherein:
    the background gas comprises at least one of nitrogen ($N_2$) and a noble gas, the noble gas comprising at least one of helium (He) and argon (Ar); and
    the modifying gas comprises a halogen gas, the halogen gas comprising at least one of chlorine ($Cl_2$), sulfur hexafluoride ($SF_6$), and tetrafluoromethane ($CF_4$).

19. The method of claim 18, wherein the biasing plasma is generated via application of radio frequency power to the chamber while the background gas and the additional gas are supplied to the chamber, the additional gas comprising a gas that interacts with a halogen-based surface modification chemistry of the surface modification region.

20. The method of claim 19, wherein the additional gas comprises hydrogen ($H_2$).

* * * * *